United States Patent
Benaissa et al.

(10) Patent No.: US 12,349,593 B2
(45) Date of Patent: Jul. 1, 2025

(54) FUNCTIONALIZED OBJECT WITH INTEGRATED MECHANICAL WAVE SENSOR AND ASSOCIATED PRODUCTION METHOD

(71) Applicants: Wormsensing, Grenoble (FR); Commissariat À L'énergie Atomique Et Aux Énergies Alternatives, Paris (FR)

(72) Inventors: Lamine Benaissa, Grenoble (FR); Ismail Degirmencioglu, Nantua (FR); Jean-Sébestien Moulet, Chambery (FR)

(73) Assignees: Wormsensing, Grenoble (FR); Commissariat À L'energie Atomique Et Aux Énergies Alternatives, Paris (FR)

( * ) Notice: Subject to any disclaimer, the term of this patent is extended or adjusted under 35 U.S.C. 154(b) by 249 days.

(21) Appl. No.: 18/245,285

(22) PCT Filed: Sep. 13, 2021

(86) PCT No.: PCT/FR2021/051559
§ 371 (c)(1),
(2) Date: Mar. 14, 2023

(87) PCT Pub. No.: WO2022/053771
PCT Pub. Date: Mar. 17, 2022

(65) Prior Publication Data
US 2023/0371387 A1    Nov. 16, 2023

(30) Foreign Application Priority Data
Sep. 14, 2020 (FR) .................... 2009290

(51) Int. Cl.
*H10N 30/30* (2023.01)
*G01H 11/08* (2006.01)
(Continued)

(52) U.S. Cl.
CPC .......... *H10N 30/302* (2023.02); *G01H 11/08* (2013.01); *H10N 30/063* (2023.02); *H10N 30/072* (2023.02); *H10N 30/87* (2023.02)

(58) Field of Classification Search
CPC .. H10N 30/302; H10N 30/063; H10N 30/072; H10N 30/87; H10N 30/853;
(Continued)

(56) References Cited

U.S. PATENT DOCUMENTS

| | | | |
|---|---|---|---|
| 7,000,453 B2 * | 2/2006 | Cunningham | G01N 29/022 422/69 |
| 2012/0055257 A1 | 3/2012 | Shaw-Klein | |
| 2020/0253043 A1 | 8/2020 | Dardona et al. | |

FOREIGN PATENT DOCUMENTS

| | | |
|---|---|---|
| EP | 0561616 B1 | 6/1997 |
| EP | 3226664 | 12/2017 |

(Continued)

OTHER PUBLICATIONS

International Search Report for Application No. PCT/FR2021/051559 dated Dec. 22, 2021, 3 pages.
(Continued)

*Primary Examiner* — Peter J Macchiarolo
*Assistant Examiner* — John M Royston
(74) *Attorney, Agent, or Firm* — TraskBritt (57) ABSTRACT

A functionalized object includes at least one mechanical wave sensor providing the object with a vibration and deformation detection capability. The mechanical wave sensor comprises: a sensitive cell having a thickness less than or equal to 50 microns, and comprising an active layer made (Continued)

of a monocrystalline or polycrystalline piezoelectric material and two electrodes, which are in contact with the active layer and accessible at a first surface of the sensitive cell, and a support layer secured to the second surface of the sensitive cell and secured to the object. The functionalized object comprises at least two electrically conductive strips disposed on the first surface of the sensitive cell and on a surface of the object, each strip connecting an electrode to an electrical contact pad. A method is used for producing such a functionalized object.

20 Claims, 4 Drawing Sheets

(51) Int. Cl.
*H10N 30/063* (2023.01)
*H10N 30/072* (2023.01)
*H10N 30/87* (2023.01)

(58) Field of Classification Search
CPC ........... H10N 30/8548; H10N 30/8554; H10N 30/875; G01H 11/08; G01H 1/00; G01L 1/16
USPC .......................................................... 73/658
See application file for complete search history.

(56) References Cited

FOREIGN PATENT DOCUMENTS

| WO | 2015/055783 A | 4/2015 |
|----|---------------|--------|
| WO | 2015/055786 A1 | 4/2015 |
| WO | 2015/055788 A1 | 4/2015 |

OTHER PUBLICATIONS

International Written Opinion for Application No. PCT/FR2021/051559 dated Dec. 22, 2021, 9 pages.

* cited by examiner

FUNCTIONALIZED OBJECT WITH INTEGRATED MECHANICAL WAVE SENSOR AND ASSOCIATED PRODUCTION METHOD

CROSS-REFERENCE TO RELATED APPLICATIONS

This application is a national phase entry under 35 U.S.C. § 371 of International Patent Application PCT/FR2021/051559, filed Sep. 13, 2021, designating the United States of America and published as International Patent Publication WO 2022/053771 A1 on Mar. 17, 2022, which claims the benefit under Article 8 of the Patent Cooperation Treaty to French Patent Application Serial No. FR2009290, filed Sep. 14, 2020.

TECHNICAL FIELD

The present disclosure relates to the field of functionalizing objects with mechanical wave detection capabilities. The present disclosure relates to an object functionalized by the integration of a mechanical wave sensor on a surface of the object.

BACKGROUND

The detection and measurement of mechanical waves are essential in a large number of fields, including, for example, the preventive maintenance, development, supervision, calibration or monitoring (to ensure safety) of equipment. The fields of application can extend to consumer equipment, tools and industrial equipment (pumps, etc.), as well as land or air vehicles.

It should be recalled that a mechanical wave is a phenomenon whereby a disturbance is propagated in a material medium, without transport of matter. The disturbance corresponds to a variation of a mechanical property (speed, position, energy, etc.) of the points of a material medium; it includes vibrations and deformations.

For all industrial or transport-related applications, precise measurement of vibrations or deformations constitutes a major advantage by maximizing equipment uptime, minimizing maintenance costs and avoiding emergency repairs.

Today, vibration measurements go through discrete devices that are fixed a posteriori to the object (equipment or part of the equipment) to be functionalized. Fixing can be done, in particular, by screwing, with special precautions at the connectors (connection wires), which must not vibrate during operation; otherwise, the vibration measurement is highly tainted by errors.

The compromise for the measurement of mechanical waves is therefore governed by the congruence of performance x integration x cost. The level of performance, which includes the detection range (frequency), precision (signal to noise ratio), and compatibility with the environment, must be sufficient. The volume and the mass of the measuring device must be sufficiently small so that the integration of the device does not negatively impact the system or the target equipment. Finally, the assembly and signal processing costs must remain reasonable to promote the widespread deployment of the detection solutions.

Devices for detecting vibrations and deformations are generally made from piezoelectric materials. The latter may include solid ceramics, such as, for example, lead titano-zirconate (PZT), or of polymers, such as, in particular, polyvinylidene difluoroethylene (PVDF-TrFE).

The advantages of a ceramic are the stability over time and temperature, as well as the high performance, conferred on the sensor; a disadvantage nevertheless comes from the mass of the sensor, which requires a balance weight to eliminate the natural frequency of the sensor, and its fragility, which requires bulky protective packaging that negatively affects the integration parameter. Moreover, such sensors, based on thick layers of ceramic (thickness between 150 microns and a few millimeters), do not open up the possibility of integration on soft and flexible parts.

A sensor based on a piezoelectric polymer is inherently flexible, since very thin polymer layers are achievable (from a few microns to a few tens of microns); the performance level and temperature resistance are, however, much lower compared to ceramics. Piezoelectric polymers also suffer from polarization instability, which affects their reliability over time.

BRIEF SUMMARY

The present disclosure relates to an alternative solution to those of the state of the art, which aims to meet the performance, integration and cost objectives required for wide use of the solution. The present disclosure relates to, in particular, an object functionalized by the integration of a ceramic mechanical wave sensor and its connectors on a surface of the object.

The present disclosure relates to a functionalized object provided with at least one mechanical wave sensor providing the object with a vibration and deformation detection capability, the functionalized object being remarkable in that the mechanical wave sensor comprises:
 a sensitive cell having a thickness less than or equal to 50 microns, and comprising an active layer made of monocrystalline or polycrystalline piezoelectric material and two electrodes in contact with the active layer and accessible at a first surface of the sensitive cell,
 a support layer, secured to a second surface of the sensitive cell and secured to the object.

The functionalized object further comprises at least two electrically conductive strips disposed on the first surface of the sensitive cell and on a surface of the object, each strip connecting an electrode to an electrical contact pad.

According to advantageous features of the present disclosure, taken alone or in any feasible combination:
 the support layer is composed of a material identical to or capable of adhering to a material making up the object;
 all or part of the support layer is integrated with or into the material of the object;
 the piezoelectric material is chosen from lead titano-zirconate (PZT), aluminum nitride (AlN), zinc oxide (ZnO), lithium tantalate (LiTaO$_3$), potassium niobate (KNbO$_3$), lithium niobate (LiNbO$_3$), lead magnesium niobate titanium (PMN-PT), quartz, strontium titanate (SrTiO$_3$), barium titanate (BaTiO$_3$);
 the active layer has surface undulations in the form of wrinkles, at least on the side of the first surface;
 the functionalized object is composed of at least one material chosen from plastic such as a thermoplastic polymer, metal, carbon fiber matrices and other composite materials, excluding materials having an acoustic absorption coefficient greater than 0.6 in a frequency range from 1 Hz to 40 kHz;
 the support layer is formed from a material chosen from poly(methyl methacrylate) (PMMA), acrylonitrile butadiene styrene (ABS), high-density polyethylene (HDPE), polypropylene polyvinyl chloride (PVC), acrylonitrile styrene (SAN), acetals, polybutylene terephthalate (PBT), polyethylene terephthalate (PET), polycarbonate (PC), polyetheretherketone (PEEK), polyetherimide (PEI), polyethersulfone polyethylene ether (PPE), polyamide (NYLON), poly(phenylene sulfide) (PPS), carbon fiber matrices;

the support layer has a thickness of between 10 microns and 1 mm;

the functionalized object comprises a plurality of mechanical wave sensors;

the plurality of mechanical wave sensors share the same support layer;

the sensitive cell has lateral dimensions, at its first and second surfaces, of between 500 µm and 20 cm;

the functionalized object forms a vehicle or building structural element, an engine part, a bicycle frame, an industrial or domestic equipment cover, etc.

The present disclosure also relates to a method for producing a functionalized object as above, the production method comprising the following steps:

a) supplying a mechanical wave sensor comprising:
   a sensitive cell having a thickness less than or equal to 50 microns, and comprising an active layer made of monocrystalline or polycrystalline piezoelectric material and two electrodes in contact with the active layer and accessible at a first surface of the sensitive cell,
   a support layer having a front surface and a rear surface, its front surface being secured to a second surface of the sensitive cell, b) forming an object in a solid material, by molding, by injection or by three-dimensional printing, c) securing the mechanical wave sensor to the object,
   either during step b) by positioning the sensor such that the rear surface of the support layer is at least in contact with or integrated into the material forming the object and such that the electrodes remain accessible when the object is formed,
   or after step b) by fixing the rear surface of the support layer on a surface of the formed object by adhesion, d) depositing two electrically conductive strips on the first surface of the sensitive cell and on a surface of the object, each strip connecting an electrode to an electrical contact pad arranged on the surface.

According to advantageous features of the present disclosure, taken alone or in any feasible combination:

the mechanical wave sensor provided in step a) comprises a temporary handling layer disposed on the rear surface of the support layer, and this handling layer is removed before step c) of securing the mechanical wave sensor on the object;

step a) comprises providing a plurality of mechanical wave sensors sharing the same support layer, and step c) comprises simultaneously securing the plurality of mechanical wave sensors to the object;

step d) is carried out by screen printing, by spraying, by electrolytic growth or by direct laser sintering of metals.

BRIEF DESCRIPTION OF THE DRAWINGS

Other features and advantages of the present disclosure will become clear from the following detailed description with reference to the accompanying drawings, in which.

The figures are schematic representations that, for the sake of readability, are not necessarily to scale. The same reference signs in the figures can be used for elements of the same type.

The various possibilities (variants and embodiments illustrated and/or detailed in the following description) are to be understood as not being mutually exclusive and can be combined with one another.

DETAILED DESCRIPTION

The present disclosure relates to a functionalized object 100 provided with at least one mechanical wave sensor 10 providing the object 100 with a vibration and deformation detection capability. As stated in the introduction, the detection and measurement of vibrations and deformations can prove to be important in various fields, in particular, to anticipate the degradation of certain mechanical parts: for example, with the appearance of cracks or other structural defects in these parts, the frequency signature of the acoustic waves will change and can give warning before the breakage of the part or the appearance of other critical failures. Without this forming an exhaustive list, the functionalized object 100 may comprise, in particular:

a vehicle structural element, for example, all or part of an airplane wing, a car chassis, a bicycle frame, etc.

an engine part, for example, a carburetor cover, a turbine element, a shaft, a bearing, etc.

a building structural element, a piece of industrial or domestic equipment, for example, a pump, etc.

in general, a part made of composite materials for which fatigue or fracture modeling is complex, and which may benefit greatly from the presence of a mechanical wave sensor to anticipate the appearance of defects in its structure.

The functionalized object 100 according to the present disclosure incorporates a mechanical wave sensor 10 that comprises a sensitive cell 11 secured to a support layer 12, which is secured to the object 100.

The sensitive cell 11 is generally in the form of a label, the main surfaces 11a, 11b of which (subsequently called first surface 11a and second surface 11b) extend in the plane (x, y) in FIGS. 1A and 1B. It has lateral dimensions, in the plane (x, y), of between 0.2 mm and a few cm, typically between 0.5 mm and 5 cm. The sensitive cell 11 of the sensor 10 also has a total thickness (along the z axis in the figures) less than or equal to 50 microns, advantageously less than or equal to 30 microns. It comprises an active layer 1 of ceramic-type piezoelectric material and two electrodes 2, 3 that are in contact with the active layer 1 and accessible at the first surface 11a of the sensitive cell 11. The piezoelectric material, monocrystalline or polycrystalline, is chosen, for example, from lead titano-zirconate (PZT), aluminum nitride (AlN), zinc oxide (ZnO), lithium tantalate (LiTaO$_3$), potassium niobate (KNbO$_3$), lithium niobate (LiNbO$_3$), lead magnesium niobate titanium (PMN-PT), quartz, strontium titanate (SrTiO$_3$) and barium titanate (BaTiO$_3$).

The active layer 1 has a thickness typically between 500 nm and 40 microns.

According to an advantageous embodiment, the active layer 1 has surface undulations in the form of wrinkles, at least on the side of the first surface 11a of the sensitive cell 11. Methods for forming such surface undulations are described in documents WO2015/055788, WO2015/055783 and WO2015/055786, and apply for, for example, the production of the sensitive cell 11 of the present disclosure.

The electrodes 2, 3 of the sensitive cell 11 are made of metallic material and are in close contact with the active layer 1: they collect the charges generated by the piezoelectric effect during the deformation of the active layer 1. A deformation of the active layer 1 appears, in particular, when the latter is subjected to a mechanical wave. The electrical signal generated at the terminals of the electrodes 2, 3 is representative of the intensity and the frequency of the deformation linked to the mechanical wave.

Figure 1A:
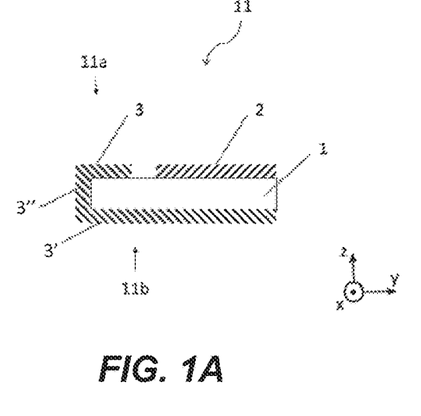
FIGS. 1A and 1B show variants of sensitive cells of a mechanical wave sensor intended to be integrated into the functionalized object according to the present disclosure.
Figure 1B:
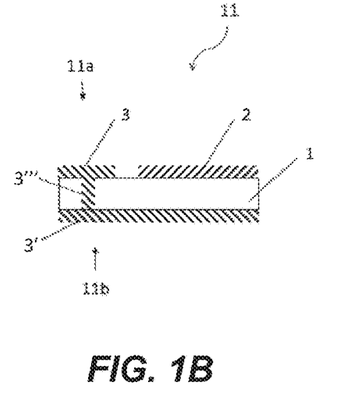

As illustrated in FIG. 1, the two electrodes 2, 3 are accessible at the first surface 11a of the cell 11. Usually, the electrodes 2, 3 are disposed on either side of the active layer 1, that is to say, on the side of the first surface 11a and on the side of the second surface 11b of the sensitive cell 11, in order to benefit from the piezoelectric effect over the entire thickness of the active layer 1. Thus, in the configuration of FIG. 1A, the electrode 3 comprises a lower portion 3' at the second surface 11b, a lateral portion 3" disposed on the edge of the active layer 1 and an upper portion at the first surface 11a of the sensitive cell 11. In the configuration of FIG. 1B, a conductive via 3''' electrically connects the lower portion 3' and the upper portion of the electrode 3. In these two configurations, the two electrodes 2, 3 are accessible at the first surface 11a of the sensitive cell 11.

The electrodes 2, 3 have a thickness (along the z axis) typically between 50 nm and 25 microns. They can comprise an electrically conductive material, chosen from among aluminum, gold, titanium, silver, tungsten, copper, nickel or conductive metal alloys; they can also comprise other layers of the diffusion barrier type (titanium nitride TiN, tantalum nitride TaN, tungsten nitride WN).

Figure 2:
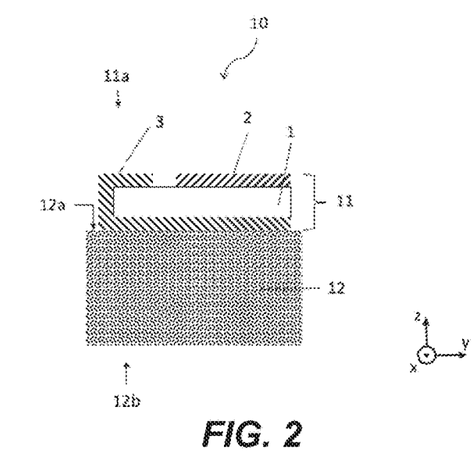
FIGS. 2, 3A, 3B and 4 show variants of mechanical wave sensors intended to be integrated into a functionalized object according to the present disclosure.

The mechanical wave sensor 10 also comprises a support layer 12, a front surface 12a of which is secured to the second surface 11b of the sensitive cell 11 (FIG. 2). The support layer 12 typically has a thickness of between 10 microns and 1 mm, for example, 200 microns.

Advantageously, the support layer 12 is composed of a material identical to a material making up the functionalized object 100, or capable of adhering to the material. Indeed, as will be described below with reference to an embodiment of the production method according to the present disclosure, the support layer 12 can be integrated into the material of the object 100, for example, during molding, injection or three-dimensional printing steps: it is therefore important that the material of the support layer 12 be compatible with the material of the object 100 and allow reliable and quality integration into the material of the functionalized object 100.

Without this being limiting, the functionalized object may be composed of at least one material chosen from plastic such as a thermoplastic polymer, metal, carbon fiber matrices, glass fibers, aramid fabrics, high molecular weight polypropylene, natural fibers, basalt fibers, and other composite materials, excluding materials having a sound absorption coefficient greater than 0.6 in the frequency range from 1 Hz to 40 kHz. It is understandable that materials with an excessively high acoustic absorption coefficient are not compatible with the principle of measurement by the integrated mechanical wave sensor 10 according to the present disclosure. The functionalized object 100 is therefore formed of one (or more) material(s) allowing sufficient propagation of the acoustic waves.

By way of examples, the support layer 12 is formed from a material chosen from poly(methyl methacrylate) (PMMA), acrylonitrile butadiene styrene (ABS), high-density polyethylene (HDPE), polypropylene polyvinyl chloride (PVC), acrylonitrile styrene (SAN), acetals, polybutylene terephthalate (PBT), polyethylene terephthalate (PET), polycarbonate (PC), polyetheretherketone (PEEK), polyetherimide (PEI), polyethersulfone polyethylene ether (PPE), polyamide (NYLON), poly(phenylene sulfide) (PPS), polyepoxides and carbon fiber matrices.

According to a first variant, the support layer 12 has substantially the same lateral dimensions (in the plane (x, y)) as the sensitive cell 11 (FIG. 2).

Figure 3A:
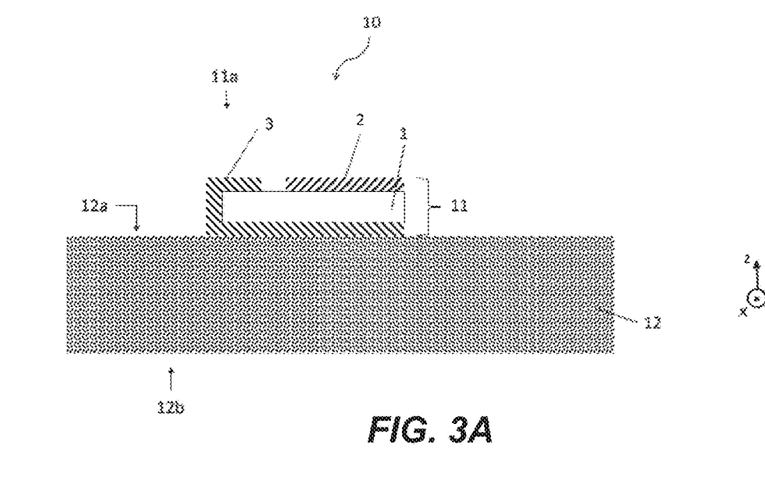
Figure 3B:
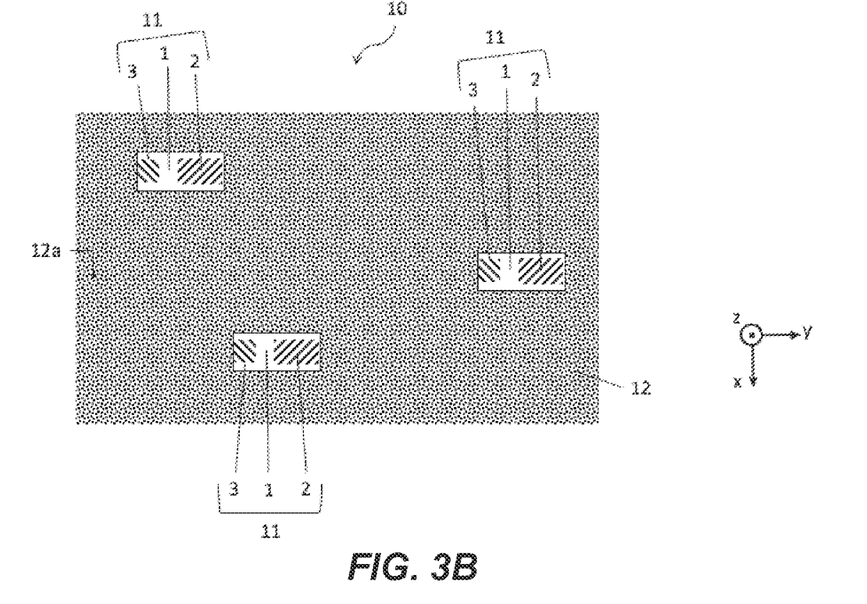

According to a second variant, the support layer 12 has dimensions greater than those of the cell 11, as illustrated in FIGS. 3A (in section) and 3B (in plan view): the sensitive cell 11 represents, for example, a label disposed on a sheet of larger dimensions acting as support layer 12. Such a configuration can facilitate the positioning of the sensitive cell 11 during its attachment to the functionalized object 100; this will be described with reference to the production method that is the subject of the present disclosure. Still in the second variant, it is possible to have several sensitive cells 11 on the same support layer 12 (FIG. 3B). This notably allows the integration of a plurality of mechanical wave sensors 10 on the same object 100, the sensors 10 sharing the same support layer 12. This variant also allows easy and precise positioning of the sensitive cells 11 on the flat support layer 12, prior to the integration of the assembly (sensors 10) on the object 100, which may be flat or curved.

Figure 4:
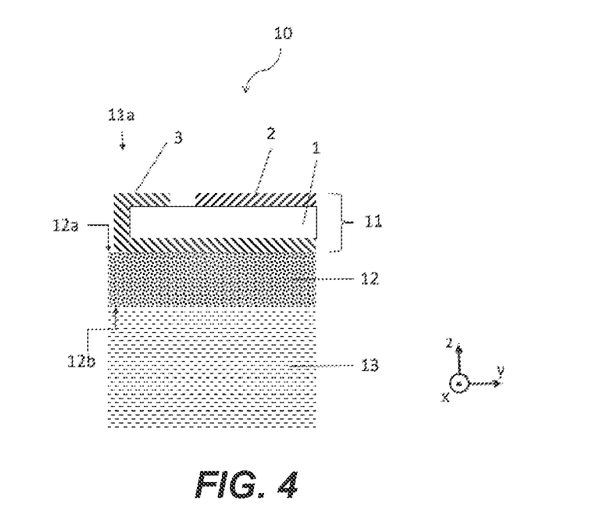

Finally, according to a third variant, the mechanical wave sensor 10 comprises a handling layer 13, temporarily attached to the rear surface 12b of the support layer 12 (FIG. 4). This handling layer 13 makes it possible, in particular, to handle the sensor 10 when its total thickness is small, in particular, less than 50 microns, or even less than 20 microns. By way of example, it may comprise a self-adhesive plastic film made of polyethylene terephthalate (PET). The handling layer 13 is temporary and is intended to be removed before securing the sensor 10 to the object 100.

Figure 5A:
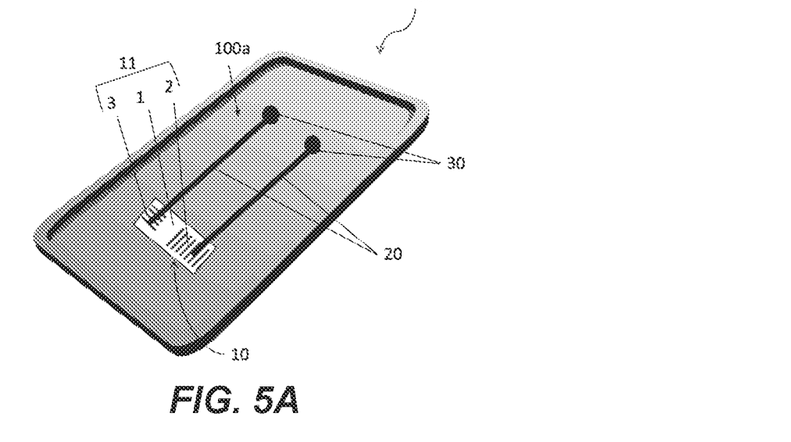
FIGS. 5A and 5B show a functionalized object according to the present disclosure.

Thus, whatever the variant considered, a rear surface 12b of the support layer 12 is secured to the object 100, as illustrated, for example, in FIG. 5A.

According to the present disclosure, the functionalized object 100 further comprises at least two electrically conductive strips 20, disposed on the first surface 11a of the sensitive cell 11 and on a surface 100a of the object 100 (FIG. 5A). Each strip 20 electrically connects an electrode 2, 3 to an electrical contact pad 30. The strips 20 can be made of a material chosen from silver, copper, aluminum, or a carbon-based paste.

The electrical signal generated by the sensor 10 is therefore intended to be recovered at the contact pads 30 and transmitted to a controller or to an electronic unit capable of processing and interpreting the signal.

The strips are deposited on and secured to the surface 100a of the functionalized object 100. This makes it possible to eliminate any problem of vibration of the connectors of the mechanical wave sensor 10, which is liable to taint the measurements of the sensor with error.

Figure 5B:
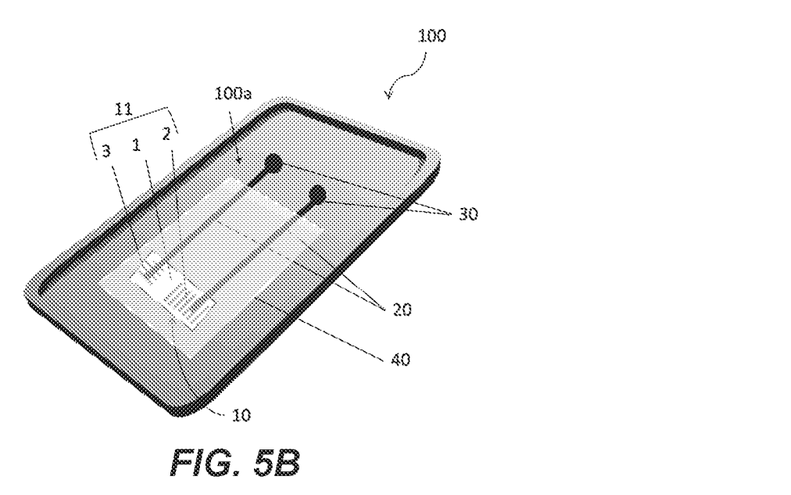

In some cases, an insulating layer 40 may be disposed on the conductive strips 20, on the mechanical wave sensor 10 and on part of the surface 100a of the object 100, so as to insulate and protect the assembly (FIG. 5B).

In the example of FIGS. 5A and 5B, the functionalized object 100 takes the form of a flat cover, to facilitate its representation. It could of course take any shape, flat, curved or more complex, depending on the areas and applications targeted.

The functionalized object 100 according to the present disclosure is capable of accurately detecting mechanical waves (vibrations or deformations) developing in the object, owing to the integration of the sensor 10 as previously described. The sensitive cell 11 is based on a crystalline piezoelectric material, which gives it excellent sensitivity and high measurement reliability. Furthermore, the small thickness of the sensitive cell 11 avoids having to take countermeasures as to the natural frequency of the crystal of the active layer 1. The conductive strips 20 deposited directly on the surface 100a of the object 100 allow effective connectivity, which does not contribute noise to the measurement of the sensor 10. Furthermore, the mechanical wave sensor 10 with its conductive strips 20 contributes only a very small additional mass to the functionalized object 100, due to its dimensions and its composition.

Finally, the mechanical wave sensor 10 is particularly easy to integrate into the object 100 because of its support layer 12: securing the support layer 12 to the object 100 or in the material of the object 100 makes it possible to position one or more sensitive cells 11 easily and precisely in an area of interest of the object 100.

The present disclosure also relates to a production method for a functionalized object 100 as described above. The production method comprises a first step a) of supplying a mechanical wave sensor 10. The latter comprises a sensitive cell 11 secured to a support layer 12. The characteristics of the sensitive cell 11 and of the support layer 12 are those described previously and are therefore not repeated here.

The sensitive cell 11 may be assembled on the support layer 12 by the known techniques of adhesive bonding. Alternatively, the support layer 12 may be deposited on the second surface of the sensitive cell 11, for example, by centrifugal coating ("spin coating") or strip casting, dipping ("dip coating"), spraying deposition ("spray coating") or screen printing. Reference may be made, in particular, to the publication by T. Dufay et al concerning a process for transferring a thin film of PZT onto a polymer substrate ("New process for transferring PZT thin film onto polymer substrate," 2016 Joint IEEE International Symposium on the Applications of Ferroelectrics, European Conference on Application of Polar Dielectrics, and Piezoelectric Force Microscopy Workshop (ISAF0/ECAPD/PFM)).

In step a) of the process, one or more sensitive cell(s) 11 (to respectively form one or more mechanical wave sensor (s) 10) is/are secured to the support layer 12 and may be positioned with precision on the latter by known techniques (for example, "pick and place").

The method then comprises a step b) of forming, in a solid material, the object 100 intended to be functionalized. This step is based on molding, thermoforming, injection or three-dimensional printing, techniques known from the state of the art.

The object 100 may be composed of, for example, at least one material chosen from plastic (such as a thermoplastic polymer), metal, carbon fiber matrices, glass fibers, aramid fabrics, high molecular weight polypropylene, natural fibers, basalt fibers, and other composite materials or combinations of the aforementioned materials. According to the present disclosure, the object 100 is composed of one or more material(s) having a sound absorption coefficient less than or equal to 0.6 in the frequency range from 1 Hz to 40 kHz, so as to allow the propagation of mechanical waves in the material(s).

The production method also comprises a step c) of securing the mechanical wave sensor 10 to the object 100. This step may be carried out according to different embodiments.

According to a first embodiment, this securing step is done during step b), by positioning the sensor 10 such that the rear surface 12b of the support layer 12 is at least in contact with or integrated into the material forming the object 100 and such that the electrodes 2, 3 remain accessible when the object 100 is formed.

Figure 6A:
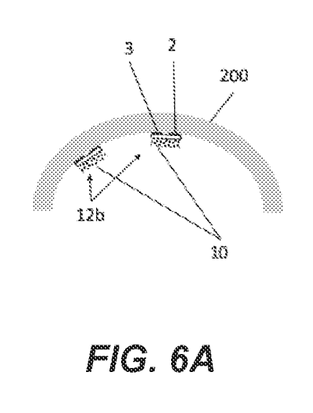
FIGS. 6A, 6B, and 6C show steps of a method for producing a functionalized object, according to a first embodiment of the present disclosure.
Figure 6B:
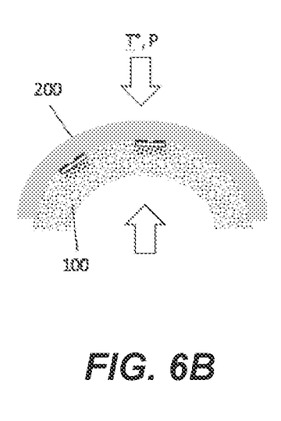

In the example illustrated in FIGS. 6A-6C, the sensor(s) 10 is (are) held in a mold 200, typically by a vacuum gripping system; the electrodes 2, 3 are placed on the side of the mold 200 (FIG. 6A). The material, for example, thermoplastic or a composite material as mentioned above, intended to form the object 100 is introduced into the mold and subjected to temperature and pressure conditions allowing the molding of the object 100 (FIG. 6B). Alternatively, the sensor(s) 10 are combined with the material intended to form the object 100, before the assembly is introduced into the mold 200.

Figure 6C:
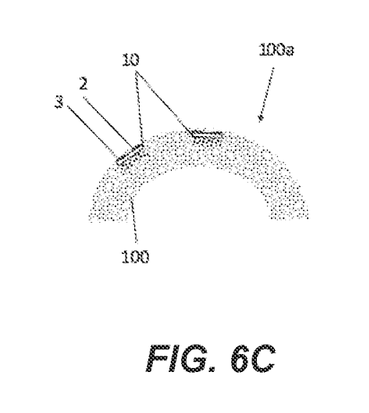

When the object 100 is removed from the mold 200, the mechanical wave sensor(s) 10 is (are) integrated into the material of the object 100, as shown in FIG. 6C. This integration is all the more reliable if the material of the support layer 12 is chosen to be identical to the material of the object 100, or compatible with the latter in terms of adhesion and with the technique for forming the object 100: all or part of the material of the support layer 12 may be intermixed or may have inter-diffused with the material of the object 100. The sensitive cell 11, made of crystalline and metallic materials, easily supports the stated techniques for forming the object 100.

According to a second embodiment, the mechanical wave sensor 10 is secured after step b), by fixing the rear surface 12b of the support layer 12 by adhesion on a surface 100a of the formed object 100. Adhesion can be obtained by means of an adhesive, such as, for example, a cyanoacrylate or acrylic adhesive, by thermocompression or by dissolution.

According to one or the other of the embodiments, step a) may comprise supplying a plurality of mechanical wave sensors 10 sharing or not sharing the same support layer 12, as mentioned with reference to FIG. 3B. In this case, step c) comprises simultaneously securing the plurality of mechanical wave sensors 10 to the object 100. In the particular case where the sensors 10 share the same support layer 12, one can imagine that the latter has a particular shape and/or dimensions, adapted to position the sensors 10 with precision in the mold 200 or opposite the object 100 on which they must be integrated or assembled. It is also easy to provide the areas of the object 100 that are difficult to access (for example, corners) with sensors 10 through suitable positioning of the support layer 12 in the mold 200, the sensitive cells 11 having been distributed on the support layer 12 beforehand with knowledge of the geometry of the object 100.

According to a variant, also compatible with the aforementioned first and second embodiments, the mechanical wave sensor 10 provided in step a) comprises a temporary handling layer 13, disposed on the rear surface 12b of the support layer 12. Such a layer 13 is removed before step c) of securing the mechanical wave sensor 10 to the object 100.

Figure 7A:
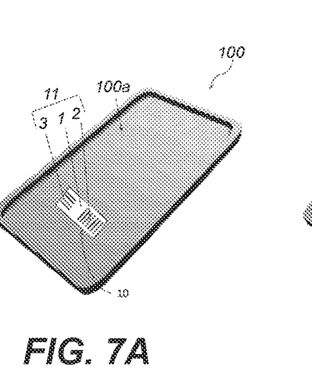
FIGS. 7A, 7B, and 7C show steps of a method for producing a functionalized object, according to the present disclosure.
Figure 7B:
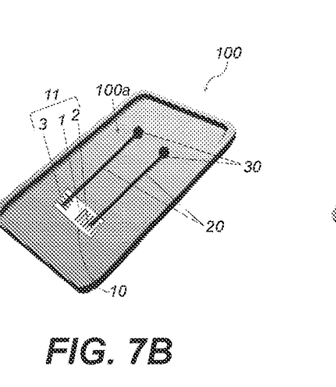
Figure 7C:
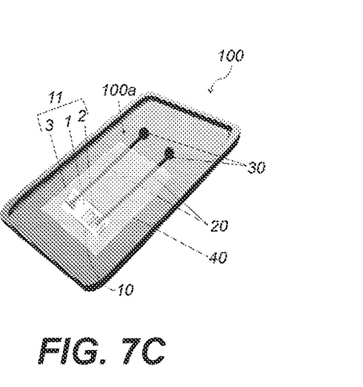

After securing the mechanical wave sensor 10 to a surface 100a of the object 100 (FIG. 7A), the production method according to the present disclosure comprises a step d) of depositing two electrically conductive strips 20 on the first surface 11a of the sensitive cell 11 of the sensor 10 and on the surface 100a of the object 100 (FIG. 7B). Each conductive strip 20 electrically connects an electrode 2, 3 to an electrical contact pad 30 arranged on the surface 100a. A deoxidation treatment (based on dilute acid, for example), applied to the surface of the contact pad 30 and/or to the surface of the electrodes 2, 3, may be implemented to guarantee conductive electrical contact with the strips 20.

In practice, step d) may be carried out by screen printing, by spraying, by electrolytic growth or by direct laser sintering of metals.

Advantageously, after the formation of the conductive strips 20, an insulating layer 40 is deposited on the sensor 10, on the strips 20 and on part of the surface 100a of the object 100 to insulate and protect the assembly.

The insulating layer 40 is made of, for example, epoxy resin, polyurethanes, or even silicone (for example, cold-vulcanizable silicone elastomer, or RTV for "room temperature vulcanization"); it may be deposited by screen printing, coating, spraying, etc.

Of course, the present disclosure is not limited to the embodiments described and it is possible to add alternative embodiments thereto without departing from the scope of the invention as defined by the claims.

The invention claimed is:

1. A functionalized object comprising a material having a sound absorption coefficient of less than 0.6 in a frequency range ranging from 1 Hz to 40 kHz, and at least one mechanical wave sensor providing the object with a vibration and deformation detection capability, wherein the mechanical wave sensor comprises:
    a sensitive cell having a thickness less than or equal to 50 microns, and comprising an active layer made of monocrystalline or polycrystalline piezoelectric material and two electrodes in contact with the active layer and accessible at a first surface of the sensitive cell; and
    a support layer comprising a material identical to or capable of adhering to the material of the functionalized object, the support layer secured to a second surface of the sensitive cell and secured to the functionalized object, the support layer being integrated into the material of the functionalized object; and
    wherein the functionalized object further comprises at least two electrically conductive strips disposed on the first surface of the sensitive cell and on a surface of the functionalized object, each strip connecting an electrode to an electrical contact pad.

2. The functionalized object of claim 1, wherein the polycrystalline piezoelectric material is chosen from among the group consisting of lead titano-zirconate (PZT), aluminum nitride (AlN), zinc oxide, (ZnO), lithium tantalate (LiTaO$_3$), potassium niobate (KNbO$_3$), lithium niobate (LiNbO$_3$), lead magnesium niobate titanium (PMN-PT), quartz, strontium titanate (SrTiO$_3$), barium titanate (BaTiO$_3$).

3. The functionalized object of claim 2, wherein the active layer has surface undulations in the form of wrinkles, at least on the side of at the first surface of the active layer.

4. The functionalized object of claim 3, wherein the material of the functionalized object comprises at least one material chosen from among the group consisting of a polymer material, a metal material, and a composite material.

5. The functionalized object of claim 4, wherein the support layer comprises a material chosen from among the group consisting of poly, (PMMA), acrylonitrile butadiene styrene (ABS), high-density polyethylene (HDPE), polypropylene polyvinyl chloride (PVC), acrylonitrile styrene (SAN), acetals, polybutylene terephthalate (PBT), polyethylene terephthalate (PET), polycarbonate (PC), polyetheretherketone (PEEK), polyetherimide (PEI), polyethersulfone polyethylene ether (PPE), polyamide, (NYLON), poly(phenylene sulfide) (PPS), polyepoxides, and carbon fiber matrices.

6. The functionalized object of claim 5, wherein the support layer has a thickness of between 10 microns and 1 mm.

7. The functionalized object of claim 6, further comprising a plurality of mechanical wave sensors.

8. The functionalized object of claim 7, wherein the plurality of mechanical wave sensors share the same support layer.

9. The functionalized object of claim 8, wherein the functionalized object comprises a vehicle or building structural element, an engine part, a bicycle frame or an industrial or domestic equipment cover.

10. The functionalized object of claim 1, wherein the active layer has surface undulations in the form of wrinkles, at least at the first surface of the active layer.

11. The functionalized object of claim 1, wherein the material of the functionalized object comprises at least one material chosen from among the group consisting of a polymer material, a metal material, and a composite material.

12. The functionalized object of claim 1, wherein the support layer comprises a material chosen from among the group consisting of poly(methyl methacrylate) (PMMA), acrylonitrile butadiene styrene (ABS), high-density polyethylene (HDPE), polypropylene polyvinyl chloride (PVC), acrylonitrile styrene (SAN), acetals, polybutylene terephthalate (PBT), polyethylene terephthalate (PET), polycarbonate (PC), polyetheretherketone (PEEK), polyetherimide (PEI), polyethersulfone polyethylene ether (PPE), polyamide (NYLON), poly(phenylene sulfide) (PPS), polyepoxides, and carbon fiber matrices.

13. The functionalized object of claim 1, wherein the support layer has a thickness of between 10 microns and 1 mm.

14. The functionalized object of claim 1, further comprising a plurality of mechanical wave sensors.

15. The functionalized object of claim 14, wherein the plurality of mechanical wave sensors share the same support layer.

16. The functionalized object of claim 1, wherein the functionalized object comprises a vehicle or building structural element, an engine part, a bicycle frame or an industrial or domestic equipment cover.

17. A method of producing a functionalized object, the method comprising the following steps:
    a) supplying a mechanical wave sensor comprising:
        a sensitive cell having a thickness less than or equal to 50 microns, and comprising an active layer of monocrystalline or polycrystalline piezoelectric material and two electrodes in contact with the active layer and accessible at a first surface of the sensitive cell; and a support layer having a front surface and a rear surface, its front surface being secured to a second surface of the sensitive cell; then b) forming an object in a solid material, by molding, by injection or by three-dimensional printing;

c) securing the mechanical wave sensor on the object, during step b) by positioning the mechanical wave sensor such that the rear surface of the support layer is at least in contact with or integrated into the solid material forming the object and such that the electrodes remain accessible when the object is formed; then d) depositing two electrically conductive strips on the first surface of the sensitive cell and on a surface of the object, each strip connecting an electrode to an electrical contact pad arranged on the surface.

18. The method of claim 17, wherein:

the mechanical wave sensor provided in step a) comprises a temporary handling layer disposed on the rear surface of the support layer; and the temporary handling layer is removed before step c) of securing the mechanical wave sensor on the object.

19. The method of claim 17, wherein:

step a) comprises providing a plurality of mechanical wave sensors sharing the same support layer; and step c) comprises simultaneously securing the plurality of mechanical wave sensors to the object.

20. The method of claim 17, wherein step d) is carried out by screen printing, by spraying, by electrolytic growth or by direct laser sintering of metals.

\* \* \* \* \*

UNITED STATES PATENT AND TRADEMARK OFFICE
CERTIFICATE OF CORRECTION

PATENT NO. : 12,349,593 B2  
APPLICATION NO. : 18/245285  
DATED : July 1, 2025  
INVENTOR(S) : Lamine Benaissa, Ismail Degirmencioglu and Jean-Sébestien Moulet Page 1 of 1

It is certified that error appears in the above-identified patent and that said Letters Patent is hereby corrected as shown below:

In the Specification

| | | | |
|---|---|---|---|
| | Column 7, | Line 52, | change "(ISAF0/ECAPD/PFM))." to --(ISAF/ECAPD/PFM)).-- |

In the Claims

| | | | |
|---|---|---|---|
| Claim 2, | Column 9, | Line 58, | change "nitride (AIN), zinc" to --nitride AlN), zinc-- |
| Claim 2, | Column 9, | Line 58, | change "zinc oxide, (ZnO)," to --zinc oxide (ZnO),-- |
| Claim 3, | Column 9, | Lines 64-65, | change "least on the side of at the" to --least at the-- |
| Claim 5, | Column 10, | Line 6, | change "of poly, (PMMA)," to --of poly(methyl methacrylate) (PMMA),-- |
| Claim 5, | Column 10, | Line 12, | change "polyamide, (NYLON)," to --polyamide (NYLON),-- |

Signed and Sealed this  
Nineteenth Day of August, 2025

Coke Morgan Stewart  
*Acting Director of the United States Patent and Trademark Office*